US 11,282,915 B2

(12) United States Patent
Yuan et al.

(10) Patent No.: US 11,282,915 B2
(45) Date of Patent: Mar. 22, 2022

(54) DISPLAY PANEL AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/963,975

(22) PCT Filed: Sep. 10, 2019

(86) PCT No.: PCT/CN2019/105159
§ 371 (c)(1),
(2) Date: Jul. 22, 2020

(87) PCT Pub. No.: WO2021/046717
PCT Pub. Date: Mar. 18, 2021

(65) Prior Publication Data
US 2021/0202678 A1    Jul. 1, 2021

(51) Int. Cl.
*G09G 3/3233* (2016.01)
*H01L 27/32* (2006.01)
*G09G 3/00* (2006.01)

(52) U.S. Cl.
CPC ......... *H01L 27/3279* (2013.01); *G09G 3/006* (2013.01); *G09G 3/3233* (2013.01); *G09G 2300/0809* (2013.01); *G09G 2330/12* (2013.01)

(58) Field of Classification Search
CPC .. H01L 27/3279; G09G 3/3233; G09G 3/006; G09G 2300/0809; G09G 2330/12
See application file for complete search history.

(56) References Cited

U.S. PATENT DOCUMENTS

RE48,044 E  *  6/2020  Kang .................. G09G 3/3233
10,734,451 B2 *  8/2020  Park ..................... H01L 27/3216
(Continued)

FOREIGN PATENT DOCUMENTS

CN    106710525 A    5/2017
CN    108133947 A    6/2018
(Continued)

OTHER PUBLICATIONS

Dictionary.com, "adjacent," in Dictionary.com Unabridged. Source location: Random House, Inc. http://dictionary.reference.com/browse/adjacent, Nov. 18, 2011, p. 1.*

*Primary Examiner* — Jeff Piziali
(74) *Attorney, Agent, or Firm* — Dilworth & Barrese, LLP.; Michael J. Musella, Esq.

(57) ABSTRACT

A display panel and a display device are disclosed. The display panel includes a plurality of sub-pixel units arranged in an array, and the array includes N rows and 8M columns. Sub-pixel units in each row are divided into a plurality of sub-pixel unit groups, and each sub-pixel unit group includes a first sub-pixel unit, a second sub-pixel unit, a third sub-pixel unit, a fourth sub-pixel unit, a fifth sub-pixel unit, a sixth sub-pixel unit, a seventh sub-pixel unit and an eighth sub-pixel unit which are sequentially in eight adjacent columns along a first direction.

20 Claims, 8 Drawing Sheets

(56) References Cited

U.S. PATENT DOCUMENTS

| | | | |
|---|---|---|---|
| 10,756,302 B2* | 8/2020 | Paek | H01L 51/5012 |
| 10,867,560 B2* | 12/2020 | Yoon | H01L 27/3276 |
| 2015/0379908 A1* | 12/2015 | Kim | G09G 3/006 |
| | | | 345/84 |
| 2017/0221423 A1 | 8/2017 | Xaing et al. | |
| 2018/0122890 A1* | 5/2018 | Park | H01L 27/3248 |
| 2019/0043421 A1* | 2/2019 | Yang | G09G 3/3225 |
| 2019/0148464 A1 | 5/2019 | Yeom et al. | |
| 2019/0173057 A1* | 6/2019 | Jung | H01L 51/5281 |
| 2019/0207163 A1* | 7/2019 | Paek | H01L 27/3223 |
| 2020/0082756 A1 | 3/2020 | Lin et al. | |

FOREIGN PATENT DOCUMENTS

| | | |
|---|---|---|
| CN | 108335667 A | 7/2018 |
| CN | 109166529 A | 1/2019 |
| CN | 109785783 A | 5/2019 |
| CN | 110021627 A | 7/2019 |
| KR | 20150027906 A | 3/2015 |

\* cited by examiner

DISPLAY PANEL AND DISPLAY DEVICE

TECHNICAL FIELD

Embodiments of the present disclosure relate to a display panel and a display device.

BACKGROUND

In the field of organic light-emitting diode (OLED) displays, with the rapid development of high-resolution products, higher requirements are put forward for product yield, cost control and realization of narrow bezel.

SUMMARY

At least one embodiment of the present disclosure provides a display panel, comprising a plurality of sub-pixel units arranged in an array, and the array comprises N rows and 8M columns. Sub-pixel units in each row are divided into a plurality of sub-pixel unit groups, and each sub-pixel unit group comprises a first sub-pixel unit, a second sub-pixel unit, a third sub-pixel unit, a fourth sub-pixel unit, a fifth sub-pixel unit, a sixth sub-pixel unit, a seventh sub-pixel unit and an eighth sub-pixel unit which are sequentially in eight adjacent columns along a first direction; the display panel further comprises a plurality of power supply voltage lines, and the first sub-pixel unit, the second sub-pixel unit, the third sub-pixel unit, the fourth sub-pixel unit, the fifth sub-pixel unit, the sixth sub-pixel unit, the seventh sub-pixel unit and the eighth sub-pixel unit in a same sub-pixel unit group are connected with a same power supply voltage line to receive a first power supply voltage; and M is an integer greater than or equal to 1, and N is an integer greater than or equal to 2.

For example, in the display panel provided by at least one embodiment of the present disclosure, the plurality of power supply voltage lines are extending along a second direction, and in the each sub-pixel unit group, the same power supply voltage line is between the fourth sub-pixel unit and the fifth sub-pixel unit.

For example, in the display panel provided by at least one embodiment of the present disclosure, the first direction is a row direction of the array, and the second direction is a column direction of the array.

For example, in the display panel provided by at least one embodiment of the present disclosure, in the each sub-pixel unit group, the first sub-pixel unit, the second sub-pixel unit, the third sub-pixel unit, the fourth sub-pixel unit, the fifth sub-pixel unit, the sixth sub-pixel unit, the seventh sub-pixel unit and the eighth sub-pixel unit are axially symmetrically distributed with respect to the same power supply voltage line.

For example, in the display panel provided by at least one embodiment of the present disclosure, in the first direction, at least two adjacent sub-pixel unit groups are connected with different power supply voltage lines.

For example, the display panel provided by at least one embodiment of the present disclosure further comprises a power supply voltage bus, and the plurality of power supply voltage lines are respectively connected with the power supply voltage bus.

For example, in the display panel provided by at least one embodiment of the present disclosure, the plurality of power supply voltage lines are further configured to be detected in a detection stage to determine whether each of the plurality of power supply voltage lines is defective.

For example, the display panel provided by at least one embodiment of the present disclosure further comprises at least one auxiliary cathode line, the auxiliary cathode line extends along a second direction, and in the second direction, the auxiliary cathode line is between two adjacent sub-pixel unit groups.

For example, the display panel provided by at least one embodiment of the present disclosure further comprises an array substrate and a metal line on the array substrate, and the auxiliary cathode line is electrically connected with the metal line.

For example, the display panel provided by at least one embodiment of the present disclosure further comprises an insulation layer, a planarization layer, an auxiliary anode, and a pixel definition layer, which are on the metal line, and the auxiliary anode is in contact with the metal line through a first via-hole running through the insulation layer and the planarization layer, and the auxiliary cathode line is in contact with the auxiliary anode through a second via-hole running through the pixel definition layer.

For example, in the display panel provided by at least one embodiment of the present disclosure, the metal line comprises a source-drain electrode line and a gate line which are on the array substrate.

For example, in the display panel provided by at least one embodiment of the present disclosure, each sub-pixel unit of the plurality of sub-pixel units comprises a light emitting circuit, a pixel driving circuit for driving the light emitting circuit to emit light, and a sensing circuit for sensing the pixel driving circuit to realize external compensation; the display panel further comprises (2N+2) gate lines which are arranged along the first direction and configured to provide a gate scanning signal to the plurality of sub-pixel units; all of the pixel driving circuits in the first sub-pixel unit, the fourth sub-pixel unit, the fifth sub-pixel unit and the eighth sub-pixel unit of each of an (n)th row of sub-pixel unit groups are connected with a (2n−1)th gate line to receive the gate scanning signal and use the gate scanning signal as a scanning driving signal; all of the pixel driving circuits in the second sub-pixel unit, the third sub-pixel unit, the sixth sub-pixel unit and the seventh sub-pixel unit of the each of the (n)th row of sub-pixel unit groups are connected with a (2n)th gate line to receive the gate scanning signal and use the gate scanning signal as a scanning driving signal; all of the sensing circuits in the first sub-pixel unit, the fourth sub-pixel unit, the fifth sub-pixel unit and the eighth sub-pixel unit of the each of the (n)th row of sub-pixel unit groups are connected with a (2n+1)th gate line to receive the gate scanning signal and use the gate scanning signal as a sensing driving signal; all of the sensing circuits in the second sub-pixel unit, the third sub-pixel unit, the sixth sub-pixel unit and the seventh sub-pixel unit of the each of the (n)th row of sub-pixel unit groups are connected with a (2n+2)th gate line to receive the gate scanning signal and use the gate scanning signal as a sensing driving signal; the display panel further comprises a plurality of first data lines, a plurality of second data lines, a plurality of third data lines and a plurality of fourth data lines, which are arranged along a second direction; in the second direction, both of the first sub-pixel unit and the second sub-pixel unit in the each sub-pixel unit group are connected with a same first data line to receive a data signal, both of the third sub-pixel unit and the fourth sub-pixel unit in the each sub-pixel unit group are connected with a same second data line to receive a data signal, both of the fifth sub-pixel unit and the sixth sub-pixel unit in the each sub-pixel unit group are connected with a same third data line to receive a data signal, and both of the seventh sub-pixel unit and the eighth sub-pixel unit in the each sub-pixel unit group are connected with a same fourth data line to receive a data signal; and 1≤n≤N.

For example, in the display panel provided by at least one embodiment of the present disclosure, two gate lines are between every two adjacent rows of sub-pixel units, and two gate lines are respectively provided at two sides of the array along the second direction.

For example, in the display panel provided by at least one embodiment of the present disclosure, the sensing circuit is configured to sense the pixel driving circuit to obtain a threshold voltage or electron mobility of the pixel driving circuit.

For example, in the display panel provided by at least one embodiment of the present disclosure, in the each sub-pixel unit group, the same first data line is between the first sub-pixel unit and the second sub-pixel unit; the same second data line is between the third sub-pixel unit and the fourth sub-pixel unit; the same third data line is between the fifth sub-pixel unit and the sixth sub-pixel unit; and the same fourth data line is between the seventh sub-pixel unit and the eighth sub-pixel unit.

For example, the display panel provided by at least one embodiment of the present disclosure further comprises a plurality of first sensing lines and a plurality of second sensing lines, which are arranged along the second direction, and in the second direction, all of the first sub-pixel unit, the second sub-pixel unit, the third sub-pixel unit and the fourth sub-pixel unit in the each sub-pixel unit group are connected with a same first sensing line to receive a first reference voltage signal or output a first sensing voltage signal; and in the second direction, all of the fifth sub-pixel unit, the sixth sub-pixel unit, the seventh sub-pixel unit and the eighth sub-pixel unit in the each sub-pixel unit group are connected with a same second sensing line to receive a second reference voltage signal or output a second sensing voltage signal.

For example, in the display panel provided by at least one embodiment of the present disclosure, in the each sub-pixel unit group, the same first sensing line is between the second sub-pixel unit and the third sub-pixel unit; and the same second sensing line is between the sixth sub-pixel unit and the seventh sub-pixel unit.

For example, in the display panel provided by at least one embodiment of the present disclosure, in the each sub-pixel unit group, the first sub-pixel unit, the second sub-pixel unit, the third sub-pixel unit and the fourth sub-pixel unit are axially symmetrically distributed with respect to the same first sensing line; and the fifth sub-pixel unit, the sixth sub-pixel unit, the seventh sub-pixel unit and the eighth sub-pixel unit are axially symmetrically distributed with respect to the same second sensing line.

For example, in the display panel provided by at least one embodiment of the present disclosure, the pixel driving circuit comprises a data writing circuit, a driving circuit and a charge storage circuit; the driving circuit is connected with the data writing circuit, the charge storage circuit, the light emitting circuit and the sensing circuit, and is configured to control a driving current for driving the light emitting circuit to emit light; the data writing circuit is further connected with the charge storage circuit, and is configured to receive the scanning driving signal and write the data signal into the driving circuit in response to the scanning driving signal; the sensing circuit is further connected with the charge storage circuit and the light emitting circuit, and is configured to receive the sensing driving signal, and write a reference voltage signal into the driving circuit or read out a sensing voltage signal from the driving circuit in response to the sensing driving signal; and the charge storage circuit is further connected with the light emitting circuit, and is configured to store the data signal and the reference voltage signal that are written into the charge storage circuit.

For example, in the display panel provided by at least one embodiment of the present disclosure, the data writing circuit comprises a first transistor, a gate electrode of the first transistor is configured to receive the gate scanning signal, a first electrode of the first transistor is configured to receive the data signal, and a second electrode of the first transistor is connected with a first node; the driving circuit comprises a second transistor, a gate electrode of the second transistor is connected with the first node, a first electrode of the second transistor is connected with a power supply voltage line to receive a first power supply voltage, and a second electrode of the second transistor is connected with a second node; the charge storage circuit comprises a storage capacitor, a first electrode of the storage capacitor is connected with the first node, and a second electrode of the storage capacitor is connected with the second node; the sensing circuit comprises a third transistor, a gate electrode of the third transistor is configured to receive the gate scanning signal and use the gate scanning signal as a sensing driving signal, a first electrode of the third transistor is connected with a sensing line, and a second electrode of the third transistor is connected with the second node; and the light emitting circuit comprises an organic light-emitting diode, a first electrode of the organic light-emitting diode is connected with the second node, and a second electrode of the organic light-emitting diode is configured to receive a second power supply voltage.

For example, in the display panel provided by at least one embodiment of the present disclosure, in the each sub-pixel unit group, light emitted by the first sub-pixel unit, the second sub-pixel unit, the third sub-pixel unit, the fourth sub-pixel unit, the fifth sub-pixel unit, the sixth sub-pixel unit, the seventh sub-pixel unit and the eighth sub-pixel unit comprises red light, green light and blue light.

For example, in the display panel provided by at least one embodiment of the present disclosure, in the sub-pixel units in each row, light emitted by the sub-pixel units are circulated according to an order of red light, green light, and blue light along the first direction.

For example, in the display panel provided by at least one embodiment of the present disclosure, the sub-pixel units adopt top emission structures.

For example, the display panel provided by at least one embodiment of the present disclosure further comprises a pixel definition layer on an array substrate, the pixel definition layer has an opening in each sub-pixel unit, shapes of openings of the plurality of sub-pixel units are the same, and sizes of the openings of the plurality of sub-pixel units are the same.

At least one embodiment of the present disclosure further provides a display device, comprising the display panel according to any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
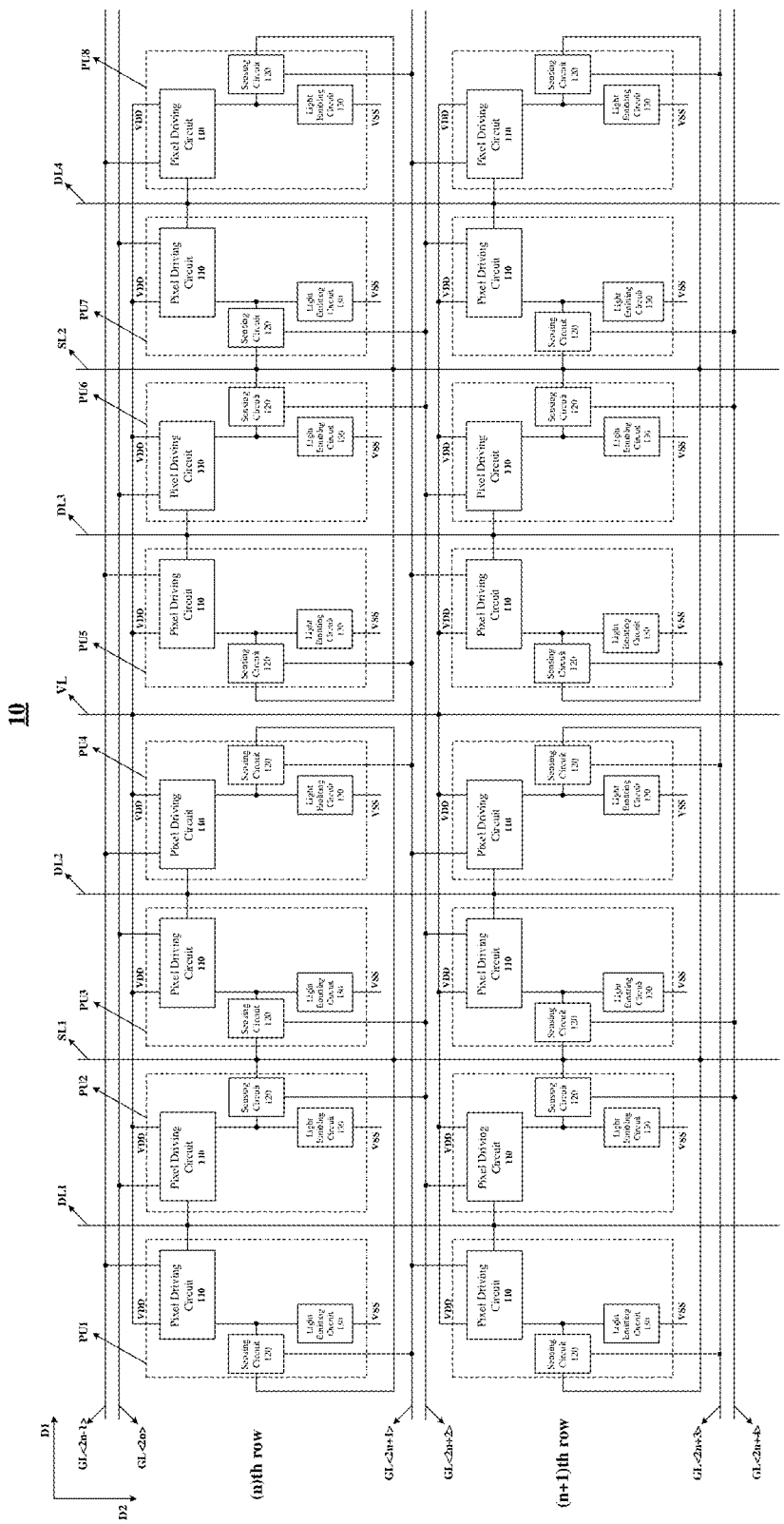
FIG. 1 is a schematic diagram of a display panel provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the field of organic light emitting diode (OLED) displays, with the rapid development of high-resolution products, higher requirements are put forward for product yield, cost control and realization of narrow bezel. For example, compared with an OLED display device with a resolution of 4K, for an OLED display device with a resolution of 8K and a larger size, because the number of sub-pixel units required to be provided is multiplied, both of the number of pins, for a gate driving circuit, of a circuit board and the number of pins, for a source driving circuit (a data driving circuit), of a circuit board are multiplied, which may bring the following problems.

1) Because the number of pins of the circuit board is increased, the region used for bonding in a layout design becomes smaller, which may cause the yield of the final product to be decreased.

2) Because the number of pins of the circuit board is increased, the cost is significantly increased.

3) Because the numbers of gate lines and data lines that are required to be provided are increased, the region for disposing sub-pixel units becomes smaller, which is not beneficial to realize high resolution and narrow bezel.

4) Because the size of the display device is larger, and the resistance of the cathode of a light-emitting device (for example, an OLED) is larger, second power supply voltages VSS provided to the cathodes of the light-emitting devices (for example, OLEDs) at different positions may have a voltage drop (IR Drop), which causes defects such as uneven display.

The display panel and the display device provided by at least one embodiment of the present disclosure can reduce the number of the data lines without increasing the number of the gate lines by adopting a design for arranging sub-pixel units cooperating with a design for signal lines (for example, gate lines, data lines, sensing lines and the like), thereby improving the product yield, reducing the cost, and facilitating the realization of narrow bezel. In addition, the resistance on the cathode can be decreased by providing an auxiliary cathode line, so that defects such as uneven display, caused by the voltage drop which is present among the second power supply voltage VSS, can be ameliorated or avoided.

At least one embodiment of the present disclosure provides a display panel 10, as illustrated in FIG. 1, the display panel 10 includes a plurality of sub-pixel units (which are illustrated by the sub-pixel units in the dashed boxes as illustrated in FIG. 1) arranged in an array, the array includes N rows and 8M columns, M is an integer greater than or equal to 1, and N is an integer greater than or equal to 2. It should be noted that, the display panel 10 illustrated in FIG. 1 only schematically illustrates two rows (the (n)th row and the (n+1)th row) and eight columns of sub-pixel units, the embodiments of the present disclosure include, but not limited to, this case, and the display panel 10 may further include more sub-pixel units as required.

For example, the sub-pixel units in each row are divided into a plurality of sub-pixel unit groups, and each sub-pixel unit group includes a first sub-pixel unit PU1, a second sub-pixel unit PU2, a third sub-pixel unit PU3, a fourth sub-pixel unit PU4, a fifth sub-pixel unit PU5, a sixth sub-pixel unit PU6, a seventh sub-pixel unit PU7 and an eighth sub-pixel unit PU8 which are sequentially in eight adjacent columns along a first direction. It should be noted that, each row of sub-pixel units in the display panel 10 illustrated in FIG. 1 only schematically illustrates one sub-pixel unit group, and the embodiments of the present disclosure include, but not limited to, this case.

For example, each sub-pixel unit of the plurality of sub-pixel units includes a light emitting circuit 130, a pixel driving circuit 110 for driving the light emitting circuit 130 to emit light, and a sensing circuit 120 for sensing the pixel driving circuit 110 to realize external compensation. For example, the sensing circuit 120 can be used to preform sensing on the pixel driving circuit 110 during a blanking period between two adjacent display frames, for example, to obtain parameters such as threshold voltage or electron mobility in the pixel driving circuit 110, such that the external compensation can be realized and the brightness uniformity of the display panel 10 can be improved.

The display panel 10 further includes (2N+2) gate lines arranged along the first direction D1, and the (2N+2) gate lines are configured to provide gate scanning signals to the plurality of sub-pixel units. For example, the first direction D1 is the row direction of the array of the display panel 10. For example, the display panel provided by the embodiments of the present disclosure adopts a dual-gate structure. For example, two gate lines are provided between every two adjacent rows of sub-pixel units, and two gate lines are respectively provided at two sides, along the second direction D2, of the array. The connection relationship between the plurality of gate lines and the sub-pixel units in each row are described in the following.

For each of the (n)th row (1 of sub-pixel unit groups, all of the pixel driving circuits 110 in the first sub-pixel unit PU1, the fourth sub-pixel unit PU4, the fifth sub-pixel unit PU5 and the eighth sub-pixel unit PU8 are connected with a (2n−1)th gate line GL<2n−1> to receive a gate scanning signal and use the gate scanning signal as a scanning driving signal. For example, the scanning driving signal can control the pixel driving circuit 110 to be turned on or turned off.

For each of the (n)th row of sub-pixel unit groups, all of the pixel driving circuits 110 in the second sub-pixel unit PU2, the third sub-pixel unit PU3, the sixth sub-pixel unit PU6 and the seventh sub-pixel unit PU7 are connected with a (2n)th gate line GL<2n> to receive a gate scanning signal and use the gate scanning signal as a scanning driving signal.

For each of the (n)th row of sub-pixel unit groups, all of the sensing circuits 120 in the first sub-pixel unit PU1, the fourth sub-pixel unit PU4, the fifth sub-pixel unit PU5 and the eighth sub-pixel unit PU8 are connected with a (2n+1)th gate line GL<2n+1> to receive a gate scanning signal and use the gate scanning signal as a sensing driving signal. For example, the sensing driving signal can control the sensing circuit 120 to be turned on or turned off.

For each of the (n)th row of sub-pixel unit groups, all of the sensing circuits 120 in the second sub-pixel unit PU2, the third sub-pixel unit PU3, the sixth sub-pixel unit PU6 and the seventh sub-pixel unit PU7 are connected with a (2n+2)th gate line GL<2n+2> to receive a gate scanning signal and use the gate scanning signal as a sensing driving signal.

For each of the (n+1)th row of sub-pixel unit groups, all of the pixel driving circuits 110 in the first sub-pixel unit PU1, the fourth sub-pixel unit PU4, the fifth sub-pixel unit PU5 and the eighth sub-pixel unit PU8 are connected with the (2n+1)th gate line GL<2n+1> to receive the gate scanning signal and use the gate scanning signal as a scanning driving signal.

For each of the (n+1)th row of sub-pixel unit groups, all of the pixel driving circuits 110 in the second sub-pixel unit PU2, the third sub-pixel unit PU3, the sixth sub-pixel unit PU6 and the seventh sub-pixel unit PU7 are connected with the (2n+2)th gate line GL<2n+2> to receive the gate scanning signal and use the gate scanning signal as a scanning driving signal.

For each of the (n+1)th row of sub-pixel unit groups, all of the sensing circuits 120 in the first sub-pixel unit PU1, the fourth sub-pixel unit PU4, the fifth sub-pixel unit PU5 and the eighth sub-pixel unit PU8 are connected with a (2n+3) gate line GL<2n+3> to receive a gate scanning signal and use the gate scanning signal as a sensing driving signal.

For each of the (n+1)th row of sub-pixel unit groups, all of the sensing circuits 120 in the second sub-pixel unit PU2, the third sub-pixel unit PU3, the sixth sub-pixel unit PU6 and the seventh sub-pixel unit PU7 are connected with a (2n+4) gate line GL<2n+4> to receive a gate scanning signal and use the gate scanning signal as a sensing driving signal.

As illustrated in FIG. 1, in the display panel 10 provided by the embodiment of the present disclosure, for the sub-pixel units in a same column, the sensing circuit 120 in the (n)th row of sub-pixel units and the pixel driving circuit 110 in the (n+1)th row sub-pixel units share a same gate line, so as to reduce the number of gate lines required to be provided.

For example, the display panel 10 further includes a plurality of first data lines DL1, a plurality of second data lines DL2, a plurality of third data lines DL3 and a plurality of fourth data lines DL4 which are arranged along the second direction D2. In the second direction D2, both of the first sub-pixel unit PU1 and the second sub-pixel unit PU2 in each sub-pixel unit group are connected with a same first data line DL1 to receive a data signal; both of the third sub-pixel unit PU3 and the fourth sub-pixel unit PU4 in each sub-pixel unit group are connected with a same second data line DL2 to receive a data signal; both of the fifth sub-pixel unit PU5 and the sixth sub-pixel unit PU6 in each sub-pixel unit group are connected with a same third data line DL3 to receive a data signal; and both of the seventh sub-pixel unit PU7 and the eighth sub-pixel unit PU8 in each sub-pixel unit group are connected with a same fourth data line DL4 to receive a data signal. For example, the second direction D2 is the column direction of the array of the display panel 10. For example, the first direction D1 intersects with the second direction D2. For example, the first direction D1 is perpendicular to the second direction D2.

In the display panel 10 provided by the embodiment of the present disclosure, in each sub-pixel unit group, the first sub-pixel unit PU1 and the second sub-pixel unit PU2 share the same first data line DL1, the third sub-pixel unit PU3 and the fourth sub-pixel unit PU4 share the same second data line DL2, the fifth sub-pixel unit PU5 and the sixth sub-pixel unit PU6 share the same third data line DL3, and the seventh sub-pixel unit PU7 and the eighth sub-pixel unit PU8 share the same fourth data line DL4. Therefore, for the display panel including 8M columns of the sub-pixel units, only M first data lines DL1, M second data lines DL2, M third data lines DL3 and M fourth data lines DL4 are required to be provided, so as to reduce the number of data lines required to be provided.

The display panel 10 provided by at least one embodiment of the present disclosure can reduce the number of data lines required to be provided without increasing the number of gate lines by sharing the data lines, so as to reduce the area of the region occupied by the data lines, such that the display panel 10 enables the sub-pixel units to be arranged in a region with a larger size, and the resolution of the display panel 10 can be improved, which is beneficial to realize a display panel with high PPI (Pixels Per Inch) and a narrow bezel. On the other hand, because the number of data lines required to be arranged are decreased, the number of pins, for the source driving circuit, of a circuit board is decreased, such that the processing yield of the display panel 10 can be improved and the production cost of the display panel 10 can be reduced.

For example, in the display panel 10 provided by some embodiments of the present disclosure, as illustrated in FIG. 1, in each sub-pixel unit group, the first data line DL1 is between the first sub-pixel unit PU1 and the second sub-pixel unit PU2; the second data line DL2 is between the third sub-pixel unit PU3 and the fourth sub-pixel unit PU4; the third data line DL3 is between the fifth sub-pixel unit PU5 and the sixth sub-pixel unit PU6; and the fourth data line DL4 is between the seventh sub-pixel unit PU7 and the eighth sub-pixel unit PU8.

In addition, it should be noted that, the display panel provided by the embodiment of the present disclosure 10 is described by taking the case where the display panel 10 includes 8M columns of sub-pixel units as an example, but the embodiments of the present disclosure do not limit the number of columns of sub-pixel units included in the display panel 10. For example, the number of columns of sub-pixel units included by the display panel 10 may be not equal to an integer multiple of eight, and in this case, for the sub-pixel units in each row, there may be one, two, three, four, five, six or seven sub-pixel unit(s) that cannot form a sub-pixel unit group.

As illustrated in FIG. 1, the display panel 10 provided by some embodiments of the present disclosure may further include a plurality of first sensing lines SL1 and a plurality of second sensing lines SL2 that are arranged extending along the second direction D2.

In the second direction D2, all of the first sub-pixel unit PU1, the second sub-pixel unit PU2, the third sub-pixel unit PU3 and the fourth sub-pixel unit PU4 in each sub-pixel group are connected with a same first sensing line SL1 to receive a first reference voltage signal or output a first sensing voltage signal. For example, the first reference voltage signal is a low-level voltage signal, for example, the level of the low-level voltage signal is 0V.

In the second direction D2, all of the fifth sub-pixel unit PU5, the sixth sub-pixel unit PU6, the seventh sub-pixel unit PU7 and the eighth sub-pixel unit PU8 in each sub-pixel unit group are connected with a same second sensing line SL2 to receive a second reference voltage signal or output a second sensing voltage signal. For example, the second reference voltage signal is a low-level voltage signal, for example, the level of the low-level voltage signal is 0V.

For example, a reference voltage signal (the first reference voltage signal or the second reference voltage signal) can be provided to a sensing circuit 120 through a sensing line (the first sensing line SL1 or the second sensing line SL2). In the case where the sensing circuit 120 is turned on, the reference voltage signal can be provided to the light emitting circuit 130 and the pixel driving circuit 110 to perform, for example, a reset operation on the light emitting circuit 130 and the pixel driving circuit 110.

For example, during a blanking period between two adjacent display frames, the sensing circuit 120 may be turned on, so that a sensing voltage signal obtained by sensing the pixel driving circuit 110 is output through a sensing line (the first sensing line SL1 or the second sensing line SL2), thereby realizing the external compensation, and thus the brightness uniformity of the display panel 10 can be improved. For example, the sensing circuit 120 can compensate the threshold voltage and the electron mobility of the pixel driving circuit 110, and can compensate the light emitting circuit 130.

For example, in the display panel 10 provided by some embodiments of the present disclosure, as illustrated in FIG. 1, in each sub-pixel unit group, the first sensing line SL1 is between the second sub-pixel unit PU2 and the third sub-pixel unit PU3; and the second sensing line SL2 is between the sixth sub-pixel unit PU6 and the seventh sub-pixel unit PU7.

For example, in each sub-pixel unit group, the first sub-pixel unit PU1, the second sub-pixel unit PU2, the third sub-pixel unit PU3 and the fourth sub-pixel unit PU4 are axially symmetrically distributed with respect to the first sensing line SL1; and the fifth sub-pixel unit PU5, the sixth sub-pixel unit PU6, the seventh sub-pixel unit PU7 and the eighth sub-pixel unit PU8 are axially symmetrically distributed with respect to the second sensing line SL2.

In the display panel 10 provided by the embodiment of the present disclosure, for each sub-pixel unit group, the layout structure can be optimized in layout design by adopting the above axisymmetrical distribution design with respect to the sensing line (the first sensing line SL1 or the second sensing line SL2), such that the risk of short circuit can be reduced and the yield can be increased.

As illustrated in FIG. 1, the display panel 10 provided by some embodiments of the present disclosure may further include a plurality of power supply voltage lines VL; for example, the plurality of power supply voltage lines VL are arranged extending along the second direction D2. it should be noted that, FIG. 1 only schematically illustrates two rows and eight columns of sub-pixel units of the display panel 10, and only schematically illustrates one power supply voltage line VL, and the embodiments of the present disclosure do not limit the number of power supply voltage lines VL included in the display panel 10.

For example, the first sub-pixel unit PU1, the second sub-pixel unit PU2, the third sub-pixel unit PU3, the fourth sub-pixel unit PU4, the fifth sub-pixel unit PU5, the sixth sub-pixel unit PU6, the seventh sub-pixel unit PU7 and the eighth sub-pixel unit PU8 which are in a same sub-pixel unit group are connected with a same power supply voltage line VL to receive a first power supply voltage (for example, a power supply voltage VDD).

For example, the first power supply voltage is a high-level voltage, for example, the first power supply voltage is applied to the pixel driving circuit 110 to generate a driving current for driving the light emitting circuit 130 to emit light.

For example, as illustrated in FIG. 1, in each sub-pixel unit group, the power supply voltage line VL is between the fourth sub-pixel unit PU4 and the fifth sub-pixel unit PU5. As illustrated in FIG. 1, in a same sub-pixel unit group, because it is not necessary to provide a data line or a sensing line between the fourth sub-pixel unit PU4 and the fifth sub-pixel unit PU5, such that the region between the fourth sub-pixel unit PU4 and the fifth sub-pixel unit PU5 can be used for disposing the power supply voltage line VL.

For example, as illustrated in FIG. 1, in each sub-pixel unit group, the first sub-pixel unit PU1, the second sub-pixel unit PU2, the third sub-pixel unit PU3, the fourth sub-pixel unit PU4, the fifth sub-pixel unit PU5, the sixth sub-pixel unit PU6, the seventh sub-pixel unit PU7 and the eighth sub-pixel unit PU8 are axially symmetrically distributed with respect to the power supply voltage line VL.

In the display panel 10 provided by the embodiment of the present disclosure, for each sub-pixel unit group, the layout structure can be optimized in layout design by adopting the above axisymmetrical distribution design with respect to the power supply voltage line VL, such that the risk of short circuit can be reduced and the yield can be improved.

For the display panel 10 provided by some embodiments of the present disclosure, in the first direction D1, at least two adjacent sub-pixel unit groups are connected with different power supply voltage lines VL.

Figure 2:
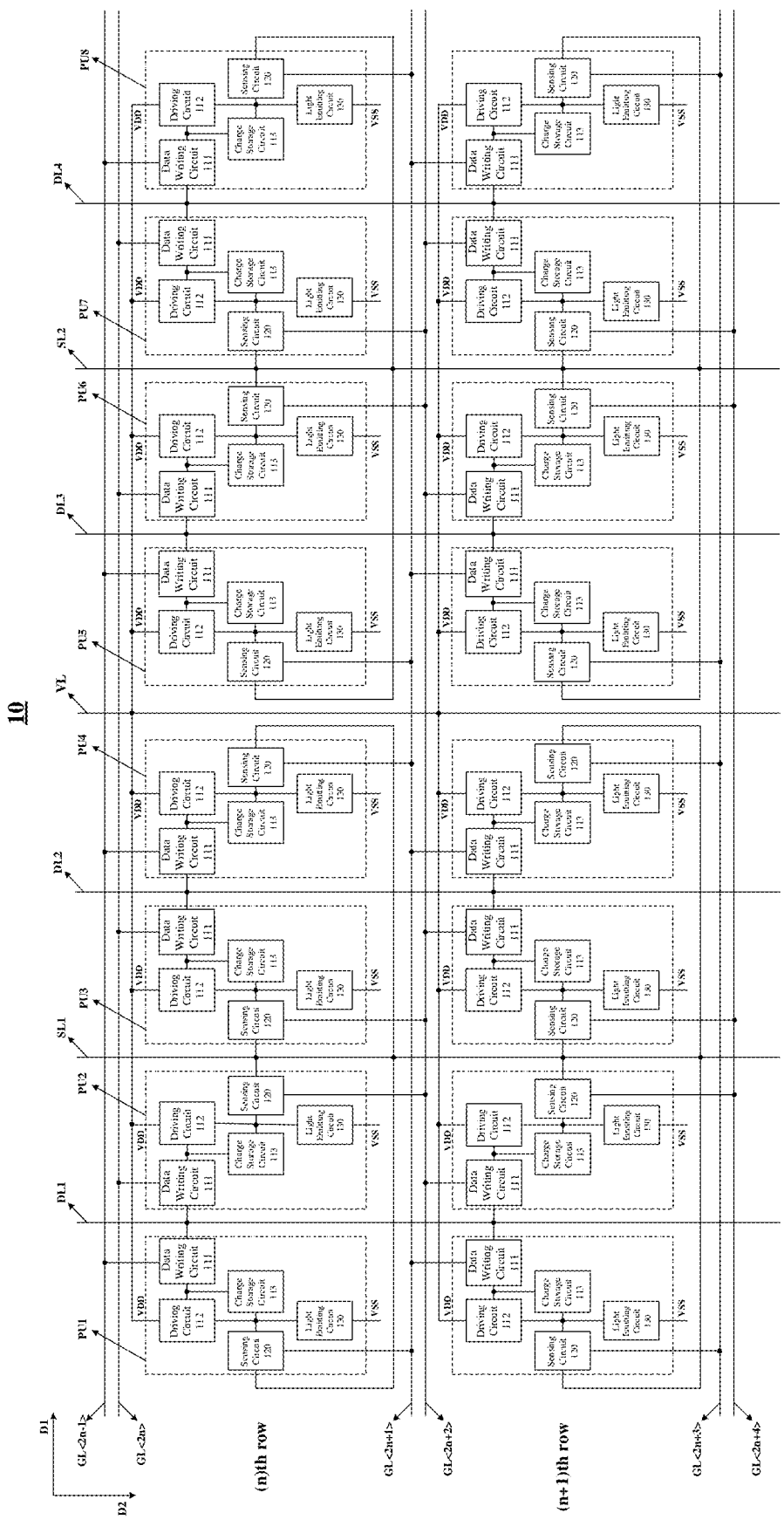
FIG. 2 is a schematic diagram of another display panel provided by at least one embodiment of the present disclosure.
Figure 3:
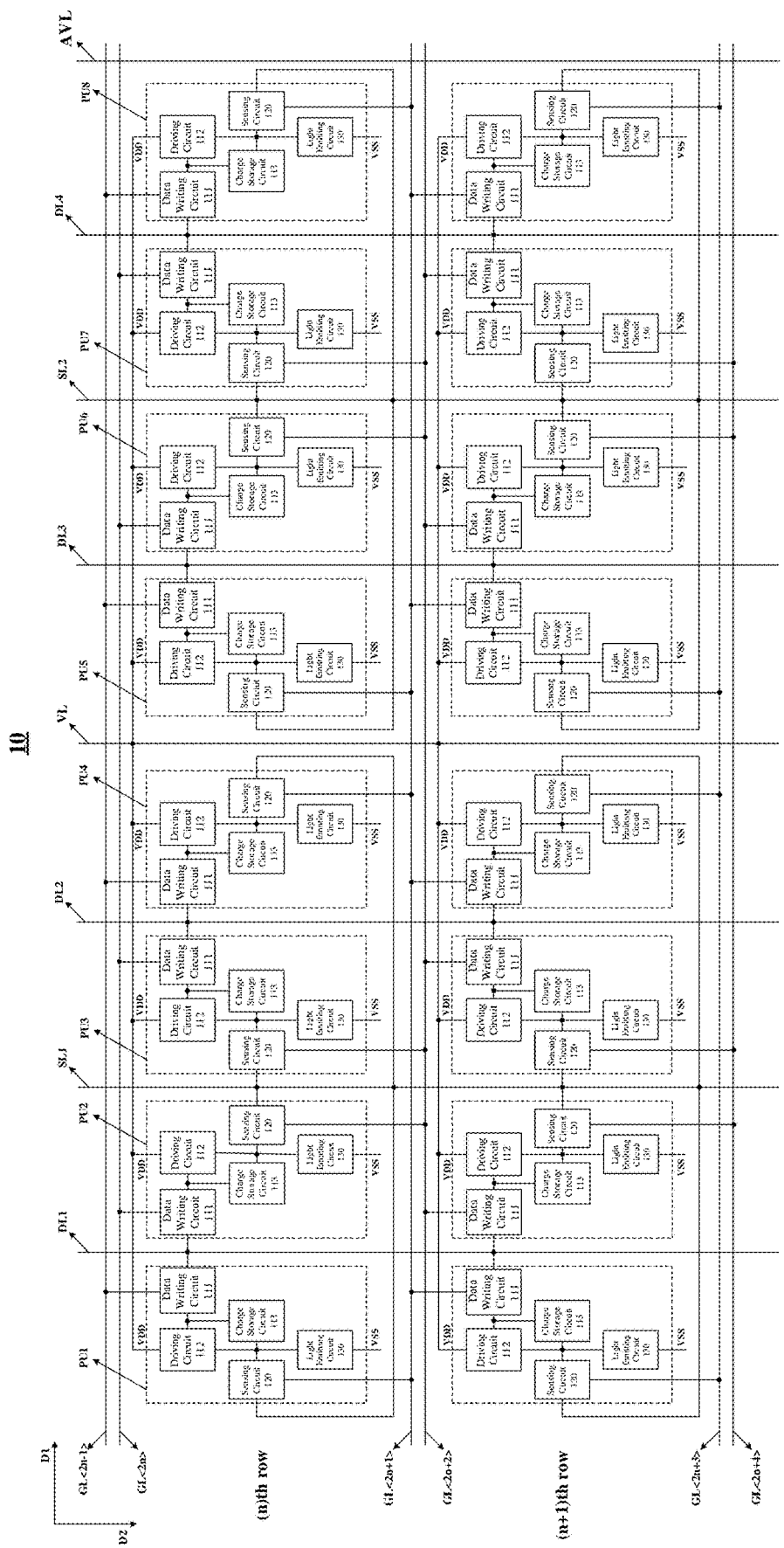
FIG. 3 is a schematic diagram of further another display panel provided by at least one embodiment of the present disclosure.
Figure 9:
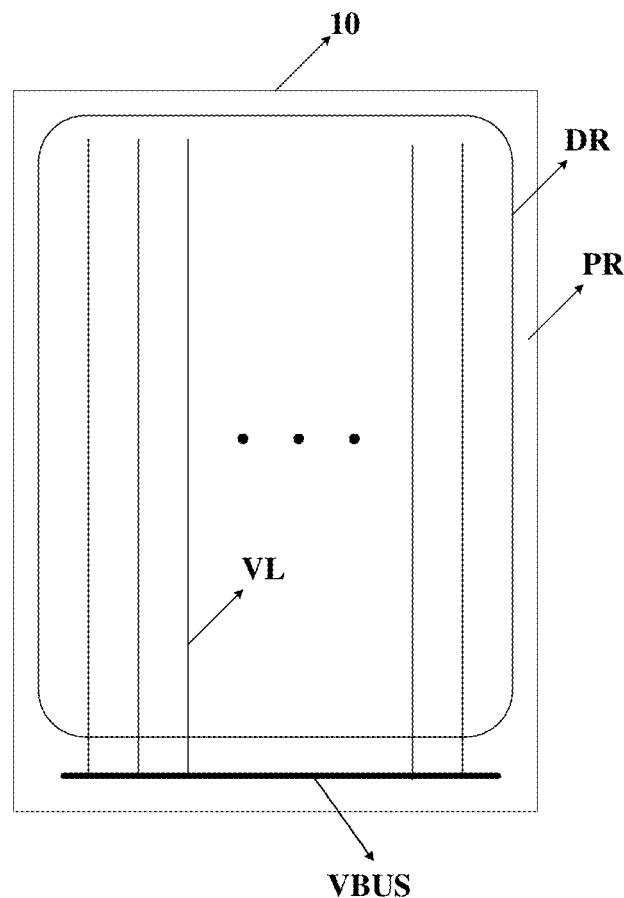
FIG. 9 is a schematic diagram of further another display panel provided by at least one embodiment of the present disclosure.

For example, as illustrated in FIG. 9, the display panel 10 provided by the embodiment of the present disclosure includes a display region DR and a periphery region PR surrounding the display region DR. For example, the display region DR is provided with a plurality of sub-pixel units arranged in an array, for example, is provided with the plurality of sub-pixel units which are arranged in an array and illustrated in the above embodiment as illustrated in FIG. 1-FIG. 3. For example, driving circuits (for example, the gate driving circuit and the source driving circuit) for the plurality of sub-pixel units in the display region DR may be disposed in the periphery region PR. For example, the plurality of power supply voltage lines VL described above are extending from the display region DR to one side of the periphery region PR.

As illustrated in FIG. 9, the display panel 10 provided by some embodiments of the present disclosure further includes a power supply voltage bus VBUS, and the power supply voltage bus VBUS is connected with a power management circuit to receive the first power supply voltage (for example, the power supply voltage VDD). The plurality of power supply voltage lines VL are respectively connected with the power supply voltage bus VBUS. For example, the power supply voltage bus VBUS may be provided in the periphery region PR. For example, the power supply voltage bus VBUS may be allowed to be connected with a source driving circuit, so as to allow the source driving circuit to respectively provide first power supply voltages, which are equal to each other, to the plurality of power supply voltage lines VL through the power supply voltage bus VBUS.

For example, in a display panel, a mesh electrode can be adopted to provide the first power supply voltage, and all of the plurality of sub-pixel units of the display panel are connected with the mesh electrode to receive the first power supply voltage, and the structure adopting the mesh electrode is referred to as a mesh structure. In the case where a defect (for example, short circuit defect or broken defect) occurs at any position of the mesh electrode of the display panel adopting the mesh structure, all of the sub-pixel units of the display panel are adversely affected.

As described above, with respect to the mesh structure, the power supply voltage lines VL in the display panel 10 provided by the embodiments of the present disclosure adopt a non-mesh structure. Even in the case where a certain one of the plurality of power supply voltage lines VL is defective, only the sub-pixel units connected with this power supply voltage line VL are affected, without affecting the sub-pixel units connected with other power supply voltage lines VL, thus improving the redundancy and stability of the display panel 10.

For example, in the display panel 10 provided by some embodiments of the present disclosure, the plurality of power supply voltage lines VL are further configured to be detected in a detection stage to determine whether each of the plurality of power supply voltage lines VL is defective.

For example, before the display panel 10 leaves the factory, the display panel 10 is detected to determine whether the display panel 10 meets product requirements. For example, in the detection stage, whether a defect occurs can be determined by detecting parameters such as voltages and currents of the plurality of power supply voltage lines VL respectively. Compared with the display panel adopting the mesh structure, the display panel 10 adopting the non-mesh structure provided by the embodiments of the present disclosure can locate the position, at which a defect is present, of the power supply voltage line VL, such that the above defect can be eliminated.

As illustrated in FIG. 2, in the display panel 10 provided by some embodiments of the present disclosure, the pixel driving circuit 110 includes a data writing circuit 111, a driving circuit 112 and a charge storage circuit 113.

The driving circuit 112 is connected with the data writing circuit 111, the charge storage circuit 113, the light emitting circuit 130 and the sensing circuit 120, and is configured to control the driving current for driving the light emitting circuit 130 to emit light. For example, the driving circuit 112 is connected with the power supply voltage line VL to receive the first power supply voltage.

The data writing circuit 111 is further connected with the charge storage circuit 113, and is configured to receive a scanning driving signal, and write a data signal into the driving circuit 112 in response to the scanning driving signal. For example, the data writing circuit 111 is connected with a gate line GL to receive the scanning driving signal, and is connected with a data line (the first data line DL1, the second data line DL2, the third data line DL3 or the fourth data line DL4) to receive the data signal.

The sensing circuit 120 is further connected with the charge storage circuit 113 and the light emitting circuit 130, and is configured to receive a sensing driving signal, and write a reference voltage signal into the driving circuit 112 or read out a sensing voltage signal from the driving circuit 112 in response to the sensing driving signal. For example, the sensing circuit 120 is connected with a gate line GL to receive the sensing driving signal, and the sensing circuit 120 is further connected with a sensing line (the first sensing line SL1 or the second sensing line SL2) to receive the reference voltage signal (the first reference voltage signal or the second reference voltage signal) or output the sensing voltage signal (the first sensing voltage signal or the second sensing voltage signal).

The charge storage circuit 113 is further connected with the light emitting circuit 130, and is configured to store the data signal and the reference voltage signal that are written into the charge storage circuit 113. For example, the light emitting circuit 130 is configured to receive a second power supply voltage VSS.

As illustrated in FIG. 3, the display panel 10 provided by some embodiments of the present disclosure further include at least one auxiliary cathode line AVL. It should be noted that, FIG. 3 only schematically illustrates one auxiliary cathode line AVL, but the embodiments of the present disclosure are not limited to this case.

For example, as illustrated in FIG. 3, the auxiliary cathode line AVL is arranged extending along the second direction D2, in the second direction D2, the auxiliary cathode line AVL is between two adjacent sub-pixel unit groups.

The resistance on the cathode connected with the auxiliary cathode line AVL can be decreased by adopting the auxiliary cathode line AVL, so that defects such as uneven display, caused by voltage drop which is present among the second power supply voltage VSS, can be ameliorated or avoided. Detailed descriptions are given in the following regarding the auxiliary cathode line AVL, and no further description will be given here.

In the following, implementation examples of each circuit of the sub-pixel unit illustrated in FIG. 3 are described with reference to FIG. 4. The following description is given by taking the sub-pixel unit (the first sub-pixel unit PU1) in the (n)th row and the first column as an example.

Figure 4:
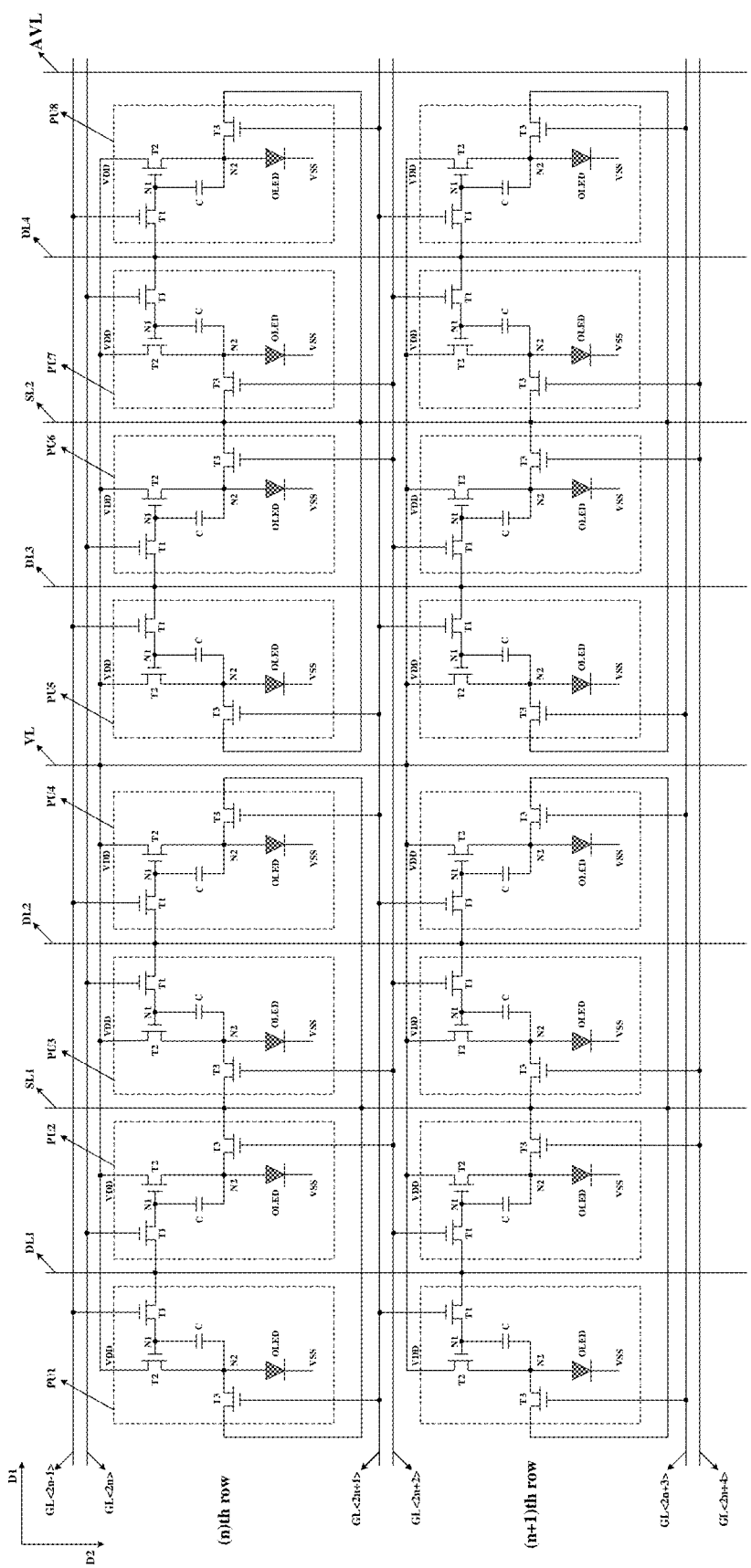
FIG. 4 is a circuit diagram of an implementation example corresponding to FIG. 3 provided by at least one embodiment of the present disclosure.

For example, as illustrated in FIG. 4, the data writing circuit 111 can be implemented as a first transistor T1. The gate electrode of the first transistor T1 is connected with the gate line GL<2n−1>, the first electrode of the first transistor T1 is connected with the first data line DL1, and the second electrode of the first transistor T1 is connected with a first node N1.

The driving circuit 112 can be implemented as a second transistor T2. The gate electrode of the second transistor T2 is connected with the first node N1, the first electrode of the second transistor T2 is connected with the power supply voltage line VL to receive the first power supply voltage, and the second electrode of the second transistor T2 is connected with a second node N2.

The charge storage circuit 113 can be implemented as a storage capacitor C, the first electrode of the storage capacitor C is connected with the first node N1, and the second electrode of the storage capacitor C is connected with the second node N2.

The sensing circuit 120 can be implemented as a third transistor T3. The gate electrode of the third transistor T3 is connected with the gate line GL<2n+1>, the first electrode of the third transistor T3 is connected with the first sensing line SL1, and the second electrode of the third transistor T3 is connected with the second node N2.

The light emitting circuit 130 can be implemented as an OLED. The OLED may be an OLED of various types, such as a top emission type, a bottom emission type, or the like, and may emit red light, green light, blue light or white light, etc., and no limitation will be given in embodiments of the present disclosure in this respect. A first electrode (for example, the anode) of the OLED is connected with the second node N2, and a second electrode (for example, the cathode) of the OLED is configured to receive the second power supply voltage VSS.

For example, in some embodiments, the second electrode of the OLED is configured to be grounded, and in this case, the second power supply voltage VSS is 0V. For example, the first power supply voltage provided by the power supply voltage line VL is a high-level voltage (for example, 5V, 10V or other suitable voltage), and the second power supply voltage VSS is a low-level voltage (for example, 0V, −5V, −10V or other suitable voltage). In the case where the second transistor T2 is turned on (or partially turned on), the first power supply voltage and the second power supply voltage VSS can be regard as one power supply, and the one power supply can be used to generate the driving current for driving the OLED.

It should be noted that the example implementations of each circuit in other sub-pixel units in FIG. 4 can be referred to FIG. 4, and will not be repeated here.

Each of the transistors used in the embodiments of the present disclosure may be a thin film transistor, a field effect transistor or other switching component having the same characteristics. In the embodiments of the present disclosure, the thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode. In addition, the transistors can be divided into N-type and P-type transistors according to the characteristics of the transistors. In a case where the transistor is the P-type transistor, the turn-on voltage is a low level voltage (e.g., 0V, −5V, −10V, or other suitable voltage), and the turn-off voltage is a high level voltage (e.g., 5V, 10V, or other suitable voltage). In a case where the transistor is the N-type transistor, the turn-on voltage is a high level voltage (for example, 5V, 10V or other suitable voltage), and the turn-off voltage is a low level voltage (for example, 0V, −5V, −10V or other suitable voltage).

Figure 5:
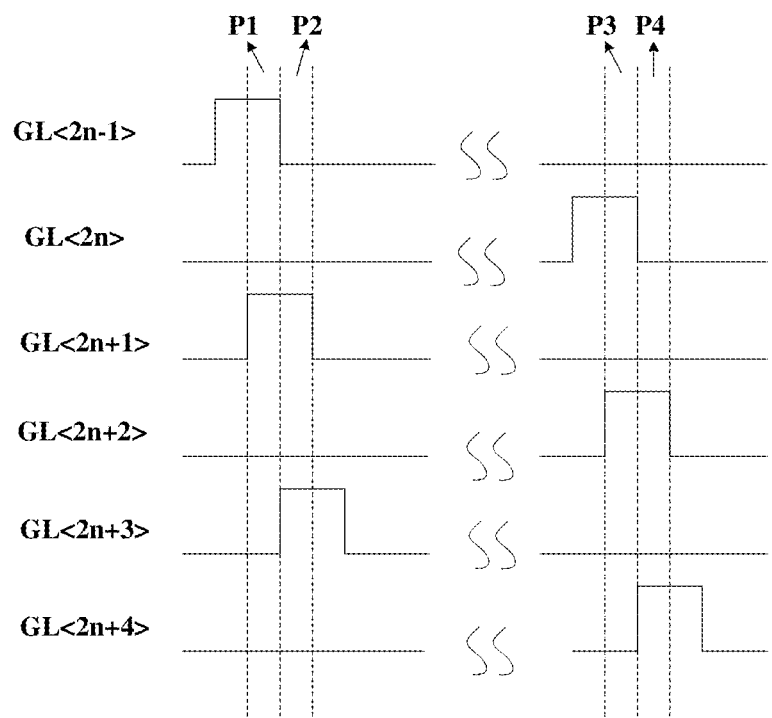
FIG. 5 is a signal timing diagram corresponding to the working principle of the display panel as illustrated in FIG. 4.

The working principle of the display panel 10 illustrated in FIG. 4 is described with reference to the signal timing diagram illustrated in FIG. 5. It should be noted that, the following descriptions is given by taking the case where the transistors in FIG. 4 are N-type transistors as an example.

In a first period P1, the gate scanning signal provided by the gate line GL<2n−1> is at a high level, and corresponding data signals are respectively written into the first sub-pixel unit PU1, the fourth sub-pixel unit PU4, the fifth sub-pixel unit PU5 and the eighth sub-pixel unit PU8 in the (n)th row.

Meanwhile, in the first period P1, because the gate scanning signal provided by the gate line GL<2n+1> is also at a high level, the first transistors T1 in the first sub-pixel unit PU1, the fourth sub-pixel unit PU4, the fifth sub-pixel unit PU5 and the eighth sub-pixel unit PU8 in the (n+1)th row can also be turned on; however, in this period, it is equal to the case where pre-charging is performed on the first sub-pixel unit PU1, the fourth sub-pixel unit PU4, the fifth sub-pixel unit PU5 and the eighth sub-pixel unit PU8 in the (n+1)th row, which does not affect the display effect.

Meanwhile, in the first period P1, because the gate scanning signal provided by the gate line GL<2n+1> is also at a high level, the third transistors T3 in the first sub-pixel unit PU1, the fourth sub-pixel unit PU4, the fifth sub-pixel unit PU5 and the eighth sub-pixel unit PU8 in the (n)th row can also be turned on, so that the reference voltage signal provided by the sensing line (the first sensing line SL1 or the second sensing line SL2) can be provided to the second node N2, that is, the second electrode of the storage capacitor C, through the third transistors T3 that are turned on, such that one electrode of the storage capacitor C is kept at a fixed level that is not changed, which is more conductive to the writing of the data signal.

In the second period P2, the gate scanning signal provided by the gate line GL<2n+1> is at a high level, so corresponding data signals are respectively written into the first sub-pixel unit PU1, the fourth sub-pixel unit PU4, the fifth sub-pixel unit PU5 and the eighth sub-pixel unit PU8 in the (n+1)th row.

Meanwhile, in the second period P2, because the gate scanning signal provided by the gate line GL<2n+3> is also at a high level, the third transistors T3 in the first sub-pixel unit PU1, the fourth sub-pixel unit PU4, the fifth sub-pixel unit PU5 and the eighth sub-pixel unit PU8 in the (n+1)th row can also be turned on, such that the reference voltage signal provided by the sensing line (the first sensing line SL1 or the second sensing line SL2) can be provided to the second node N2, that is, the second electrode of the storage capacitor C, through the third transistors T3 that are turned on, such that one electrode of the storage capacitor C is kept at a fixed level that is not changed, which is more conductive to the writing of the data signal.

Then, progressive scanning is performed until that writing of the data signal are accomplished for the last row (that is, the (N)th row) of the display panel 10, and then the display panel 10 enters into a third period P3.

In the third time period P3, the gate scanning signal provided by the gate line GL<2n> is at a high level, and corresponding data signals are respectively written into the second sub-pixel unit PU2, the third sub-pixel unit PU3, the sixth sub-pixel unit PU6 and the seventh sub-pixel unit PU7 in the (n)th row.

Meanwhile, in the third period P3, because the gate scanning signal provided by the gate line GL<2n+2> is also at a high level, the first transistors T1 in the second sub-pixel unit PU2, the third sub-pixel unit PU3, the sixth sub-pixel unit PU6 and the seventh sub-pixel unit PU7 in the (n+1)th row can also be turned on; however, in this period, it is equal to the case where pre-charging is performed on the second sub-pixel unit PU2, the third sub-pixel unit PU3, the sixth sub-pixel unit PU6 and the seventh sub-pixel unit PU7 in the (n+1)th row, which does not affect the display effect.

Meanwhile, in the third period P3, because the gate scanning signal provided by the gate line GL<2n+2> is also at a high level, the third transistors T3 in the second sub-pixel unit PU2, the third sub-pixel unit PU3, the sixth sub-pixel unit PU6 and the seventh sub-pixel unit PU7 in the (n)th row can also be turned on, such that the reference voltage signal provided by the sensing line (the first sensing line SL1 or the second sensing line SL2) can be provided to the second node N2, that is, the second electrode of the storage capacitor C, through the third transistors T3 that are turned on, such that one electrode of the storage capacitor C is kept at a fixed level that is not changed, which is more conductive to the writing of the data signal.

In the fourth period P4, the gate scanning signal provided by the gate line GL<2n+2> is at a high level, and corresponding data signals are respectively written into the second sub-pixel unit PU2, the third sub-pixel unit PU3, the sixth sub-pixel unit PU6 and the seventh sub-pixel unit PU7 in the (n+1)th row.

Meanwhile, in the fourth period P4, because the gate scanning signal provided by the gate line GL<2n+4> is also at a high level, the third transistors T3 in the second sub-pixel unit PU2, the third sub-pixel unit PU3, the sixth sub-pixel unit PU6 and the seventh sub-pixel unit PU7 in the (n+1)th row can also be turned on, such that the reference voltage signal provided by the sensing line (the first sensing line SL1 or the second sensing line SL2) can be provided to the second node N2, that is, the second electrode of the storage capacitor C, through the third transistors T3 that are turned on, such that one electrode of the storage capacitor C is kept at a fixed level that is not changed, which is more conductive to the writing of the data signal.

Then, progressive scanning is performed until that writing of the data signal are accomplished for the last row (that is, the (N)th row) of the display panel 10, such that the scanning and driving of the entire display panel 10 are accomplished.

The first sub-pixel unit PU1 and the second sub-pixel unit PU2 in each sub-pixel unit group share the same first data line DL1, the third sub-pixel unit PU3 and the fourth sub-pixel unit PU4 in each sub-pixel unit group share the second first data line DL2, the fifth sub-pixel unit PU5 and the sixth sub-pixel unit PU6 in each sub-pixel unit group share the same third data line DL3, and the seventh sub-pixel unit PU7 and the eighth sub-pixel unit PU8 in each sub-pixel unit group share the same fourth data line DL4.

So corresponding data signals are respectively written into the first sub-pixel unit PU1 and the second sub-pixel unit PU2 in each sub-pixel unit group during different periods, corresponding data signals are respectively written into the third sub-pixel unit PU3 and the fourth sub-pixel unit PU4 in each sub-pixel unit group during different periods, corresponding data signals are respectively written into the fifth sub-pixel unit PU5 and the sixth sub-pixel unit PU6 in each sub-pixel unit group during different periods, and corresponding data signals are respectively written into the seventh sub-pixel unit PU7 and the eighth sub-pixel unit PU8 in each sub-pixel unit group during different periods. It can be seen from the above descriptions, the display panel 10 provided by the embodiments of the present disclosure can perform normal scanning and driving in accordance with the corresponding timing.

The display panel 10 provided by at least one embodiment of the present disclosure can reduce the number of data lines required to be provided without increasing the number of gate lines by sharing the data lines, so as to reduce the area of the region occupied by the data lines, such that the display panel 10 enables the sub-pixel units to be arranged in a region with a larger size, and the resolution of the display panel 10 can be improved, which is beneficial to realize a display panel with high PPI (Pixels Per Inch) and a narrow bezel. On the other hand, because the number of data lines required to be arranged are decreased, the number of pins, for the source driving circuit, of a circuit board is decreased, such that the processing yield of the display panel 10 can be improved and the production cost of the display panel 10 can be reduced.

For example, in the display panel 10 provided by some embodiments, in each sub-pixel unit group, light emitted by the first sub-pixel unit PU1, the second sub-pixel unit PU2, the third sub-pixel unit PU3, the fourth sub-pixel unit PU4, the fifth sub-pixel unit PU5, the sixth sub-pixel unit PU6, the seventh sub-pixel unit PU7 and the eighth sub-pixel unit PU8 includes red light, green light and blue light. For example, the sub-pixel unit which can emit the red light is denoted as R, the sub-pixel unit which can emit the green light is denoted as G, and the sub-pixel unit which can emit the blue light is denoted as B. For example, for the sub-pixel units in the same row, along the first direction D1, the arrangement of the sub-pixel units can be RGBRGBRG-BRGBRGBR-GBRGBRGB, every eight sub-pixel units form a sub-pixel unit group, and in this case, every 24 sub-pixel units form a cycle. It should be noted that, the embodiments of the present disclosure include, but not limited to, the above arrangement of the sub-pixel units.

For example, in the display panel 10 provided by some embodiments, in each sub-pixel unit group, light emitted by the first sub-pixel unit PU1, the second sub-pixel unit PU2, the third sub-pixel unit PU3, the fourth sub-pixel unit PU4, the fifth sub-pixel unit PU5, the sixth sub-pixel unit PU6, the seventh sub-pixel unit PU7 and the eighth sub-pixel unit PU8 may further include white light, and the sub-pixel unit which can emit the white light is denoted as W. For example, for the sub-pixel units in the same row, along the first direction D1, the arrangement of the sub-pixel units can be RGBWRGBW. It should be noted that, the embodiments of the present disclosure include, but not limited to, the above arrangement of the sub-pixel units.

The layout design of the array substrate of the display panel 10 provided by at least one embodiment of the present disclosure are described in the following with reference to FIG. 6

Figure 6:
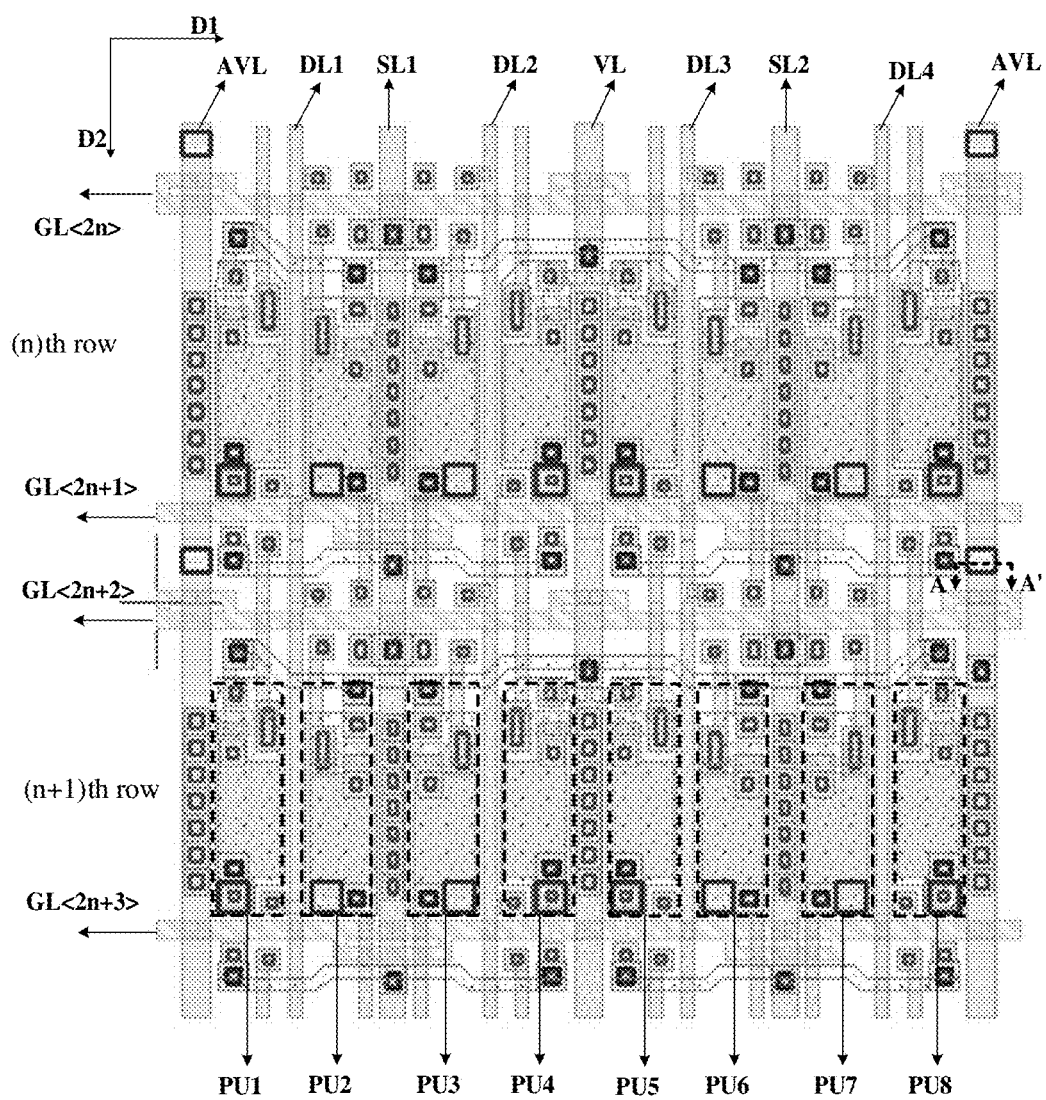
FIG. 6 is a schematic diagram of a layout of a display panel provided by at least one embodiment of the present disclosure.

FIG. 6 illustrates two rows and eight columns of sub-pixel units of the display panel 10, that is, two sub-pixel unit groups. As illustrated in FIG. 6, the gate lines GL<2n>, GL<2n+1>, GL<2n+2>, and GL<2n+3> are arranged extending along the first direction D1. The first data line DL1, the second data line DL2, the third data line DL3, the fourth data line DL4, the first sensing line SL1, the second sensing line SL2, the power supply voltage line VL and the auxiliary cathode line AVL are arranged extending along the second direction D2.

As illustrated in FIG. 6, the first data line DL1 is between the first sub-pixel unit PU1 and the second sub-pixel unit PU2. For example, the first data line DL1 is respectively connected with the first electrode of the first transistor T1 in the first sub-pixel unit PU1 and the first electrode of the first transistor T1 in the second sub-pixel unit PU2. The second data line DL2 is between the third sub-pixel unit PU3 and the fourth sub-pixel unit PU4. For example, the second data line DL2 is respectively connected with the first electrode of the first transistor T1 in the third sub-pixel unit PU3 and the first electrode of the first transistor T1 in the fourth sub-pixel unit PU4. The third data line DL3 is between the fifth sub-pixel unit PU5 and the sixth sub-pixel unit PU6. For example, the third data line DL3 is respectively connected with the first electrode of the first transistor T1 in the fifth sub-pixel unit PU5 and the first electrode of the first transistor T1 in the sixth sub-pixel unit PU6. The fourth data line DL4 is between the seventh sub-pixel unit PU7 and the eighth sub-pixel unit PU8. For example, the fourth data line DL4 is respectively connected with the first electrode of the first transistor T1 in the seventh sub-pixel unit PU7 and the first electrode of the first transistor T1 in the eighth sub-pixel unit PU8.

As illustrated in FIG. 6, in each sub-pixel unit group, the first sub-pixel unit PU1, the second sub-pixel unit PU2, the third sub-pixel unit PU3 and the fourth sub-pixel unit PU4 are axially symmetrically distributed with respect to the first sensing line SL1. For example, the first sub-pixel unit PU1 and the second sub-pixel unit PU2 are at the left side of the first sensing line SL1, and the third sub-pixel unit PU3 and the fourth sub-pixel unit PU4 are at the right side of the first sensing line SL1. For example, the first sensing line SL1 is respectively connected with the first electrodes of the third transistors T3 in the first sub-pixel unit PU1, the second sub-pixel unit PU2, the third sub-pixel unit PU3 and the fourth sub-pixel unit PU4.

In each sub-pixel unit group, the fifth sub-pixel unit PU5, the sixth sub-pixel unit PU6, the seventh sub-pixel unit PU7 and the eighth sub-pixel unit PU8 are axially symmetrically distributed with respect to the second sensing line SL2. For example, the fifth sub-pixel unit PU5 and the sixth sub-pixel unit PU6 are at the left side of the second sensing line SL2, and the seventh sub-pixel unit PU7 and the eighth sub-pixel unit PU8 are at the right side of the second sensing line SL2. For example, the second sensing line SL2 is respectively connected with the first electrodes of the third transistors T3 in the fifth sub-pixel unit PU5, the sixth sub-pixel unit PU6, the seventh sub-pixel unit PU7 and the eighth sub-pixel unit PU8.

As illustrated in FIG. 6, in each sub-pixel unit group, the power supply voltage line VL is between the fourth sub-pixel unit PU4 and the fifth sub-pixel unit PU5. For example, the power supply voltage line VL is connected with the first electrodes of the second transistors T2 in the first sub-pixel unit PU1, the second sub-pixel unit PU2, the third sub-pixel unit PU3, the fourth sub-pixel unit PU4, the fifth sub-pixel unit PU5, the sixth sub-pixel unit PU6, the seventh sub-pixel unit PU7 and the eighth sub-pixel unit PU8 to provide the first power supply voltage.

As illustrated in FIG. 6, in each sub-pixel unit group, the first sub-pixel unit PU1, the second sub-pixel unit PU2, the third sub-pixel unit PU3, the fourth sub-pixel unit PU4, the fifth sub-pixel unit PU5, the sixth sub-pixel unit PU6, the seventh sub-pixel unit PU7 and the eighth sub-pixel unit PU8 are axially symmetrically distributed with respect to the power supply voltage line VL.

In the display panel provided by embodiments of the present disclosure 10, for each sub-pixel unit group, the layout structure can be optimized in layout design by adopting the above axisymmetrical distribution design, such that the risk of short circuit can be reduced and the yield can be improved.

The power supply voltage lines VL in the display panel 10 provided by the embodiments of the present disclosure adopt a non-mesh structure. Even in the case where a certain one of the plurality of power supply voltage lines VL is defective, only the sub-pixel units connected with this power supply voltage line VL are affected, without affecting the sub-pixel units connected with other power supply voltage lines VL, thus improving the redundancy and stability of the display panel 10.

In addition, compared with the display panel adopting the mesh structure, the display panel 10 adopting the non-mesh structure provided by the embodiments of the present disclosure can also locate the position, at which a defect is present, of the power supply voltage line VL, such that the above defect can be eliminated.

As illustrated in FIG. 6, two gate lines which are between the (n)th row of sub-pixel units and the (n+1)th row of sub-pixel units are respectively GL<2n+1> and GL<2n+2>.

For example, as illustrated in FIG. 6, for each of the (n)th row of sub-pixel unit groups, all of the gate electrodes of the third transistors T3 in the first sub-pixel unit PU1, the fourth sub-pixel unit PU4, the fifth sub-pixel unit PU5 and the eighth sub-pixel unit PU8 are connected with the (2n+1)th gate line GL<2n+1> to receive a gate scanning signal and use the gate scanning signal as a sensing driving signal. For example, the sensing driving signal can control the third transistor T3 to be turned on or turned off.

For each of the (n)th row of sub-pixel unit groups, all of the gate electrodes of the third transistors T3 in the second sub-pixel unit PU2, the third sub-pixel unit PU3, the sixth sub-pixel unit PU6 and the seventh sub-pixel unit PU7 are connected with the (2n+2)th gate line GL<2n+2> to receive a gate scanning signal and use the gate scanning signal as a sensing driving signal.

For each of the (n+1)th row of sub-pixel unit groups, all of the gate electrodes of the first transistors T1 in the first sub-pixel unit PU1, the fourth sub-pixel unit PU4, the fifth sub-pixel unit PU5 and the eighth sub-pixel unit PU8 are connected with the (2n+1)th gate line GL<2n+1> to receive a gate scanning signal and use the gate scanning signal as a scanning driving signal.

For each of the (n+1)th row of sub-pixel unit groups, all of the gate electrodes of the first transistors T1 in the second sub-pixel unit PU2, the third sub-pixel unit PU3, the sixth sub-pixel unit PU6 and the seventh sub-pixel unit PU7 are connected with the (2n+2)th gate line GL<2n+2> to receive a gate scanning signal and use the gate scanning signal as a scanning driving signal.

As illustrated in FIG. 6, for the sub-pixel unit groups in each row, one auxiliary cathode line AVL is correspondingly provided for each sub-pixel unit group.

Figure 7:
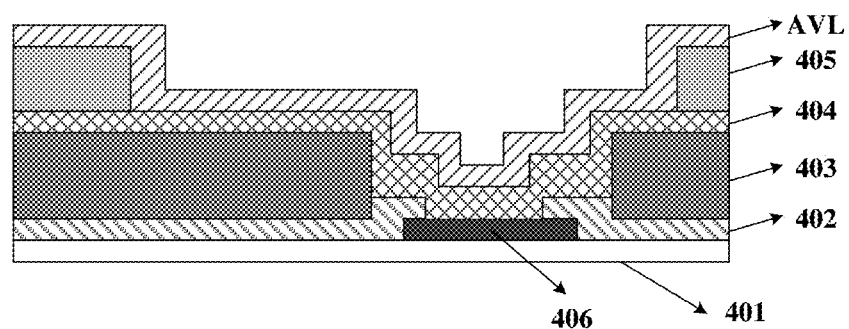
FIG. 7 is a cross-sectional diagram along line A-A' in FIG. 6.

For example, FIG. 7 is a cross-sectional diagram along line A-A' in FIG. 6. The display panel 10 provided by some embodiments of the present disclosure further includes an array substrate 401 and a metal line 406 on the array substrate 401. The auxiliary cathode line AVL is electrically connected with the metal line 406.

For example, as illustrated in FIG. 7, the display panel 10 further includes an insulation layer 402, a planarization layer 403, an auxiliary anode 404 and a pixel definition layer 405, which are on the metal line 406; the auxiliary anode 404 is in contact with the metal line 406 through a first via-hole running through the insulation layer 402 and the planarization layer 403, and the auxiliary cathode line AVL is in contact with the auxiliary anode 404 through a second via-hole running through the pixel definition layer 405.

It should be noted that, the auxiliary anode 404 illustrated in FIG. 7 is an island type electrode, and the structure of the island type electrode is different from that of the anode, which is used for emitting light, in a sub-pixel unit. For example, the auxiliary anode 404 and the anode for emitting light are in the same layer (that is, an anode layer) of the display panel 10. The auxiliary anode 404, which serves as an intermediate structure, allows the auxiliary cathode line AVL and the metal line 406 to be electrically connected.

For example, the metal line 406 may be a source-drain electrode line or a gate line on the array substrate 401. Because the metal line 406 is normally made of a metal, for example, metal copper, copper alloy, etc., the resistance of the metal line 406 is smaller.

In the display panel 10 provided by some embodiments of the present disclosure, by allowing the auxiliary cathode line AVL to be electrically connected with the metal line 406 with a smaller resistance, the resistance on the cathode connected with the auxiliary cathode line AVL can be decreased, so that defects such as uneven display, caused by the voltage drop which are present among the second power supply voltage VSS, can be ameliorated or avoided.

For example, the display panel provided by some embodiments of the present disclosure 10 can adopt a top emission structure. For example, the display panel 10 further includes a pixel definition layer on the array substrate, and the pixel definition layer has an opening in each sub-pixel unit, the shapes of the openings of the plurality of sub-pixel units are the same, and the sizes of the openings of the plurality of sub-pixel units are the same.

Figure 8:
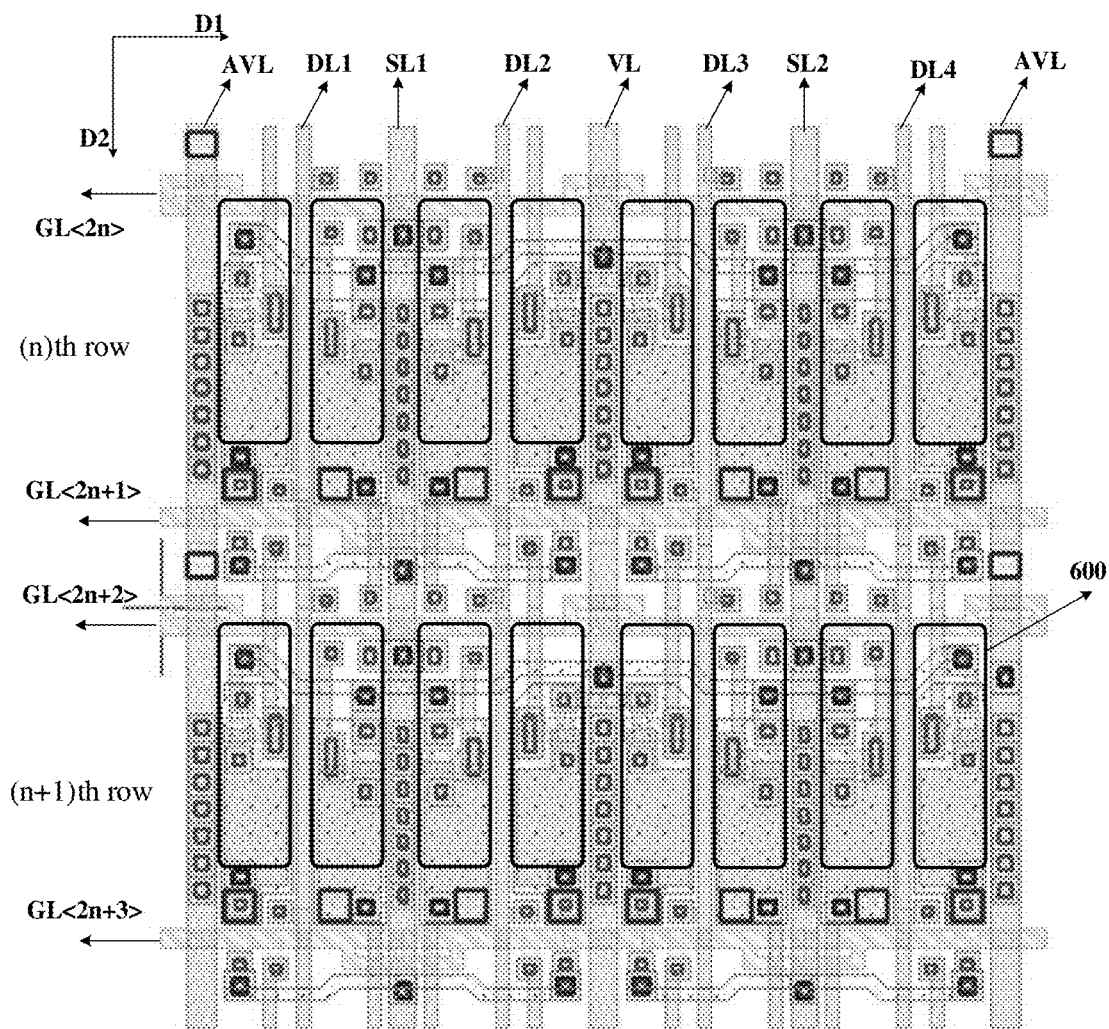
FIG. 8 is a schematic diagram of a layout of another display panel provided by at least one embodiment of the present disclosure.

FIG. 8 illustrates the opening 600 in each sub-pixel unit with a rounded rectangle with bold lines. For example, the shapes of the openings 600 of the plurality of sub-pixel units are the same, and the sizes of the openings 600 of the plurality of sub-pixel units are the same. By adopting the above design of allowing the plurality of openings 600 to be the same, the display panel 10 provided by the embodiments of the present disclosure can improve the printing efficiency in manufacturing the display panel 10; in addition, the aperture ratio of the display panel 10 can be increased. For example, the aperture ratio of the display panel 10 can reach 40%-50%, for example, can be 46%.

Figure 10:
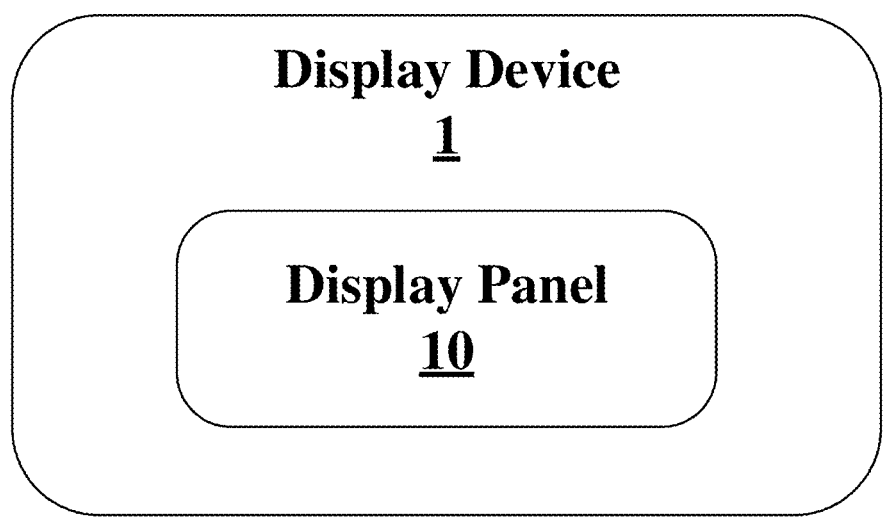
FIG. 10 is a schematic diagram of a display device provided by at least one embodiment of the present disclosure.

At least one embodiment of the present disclosure further provides a display device 1, as illustrated in FIG. 10, the display device 1 includes the display panel 10 provided by any one of the embodiments of the present disclosure, and the display device in the present embodiment can be any product or component that has a display function, such as a display, an OLED panel, an OLED TV, an electronic paper, a mobile phone, a tablet computer, a notebook computer, a digital photo frame, a navigator, etc.

The technical effects of the display device 1 provided by the embodiments of the present disclosure can refer to corresponding descriptions regarding the display panel 10 in the above embodiments, and will not be described in detail here.

What are described above is related to the illustrative embodiments of the disclosure only and not limitative to the scope of the disclosure; the scopes of the disclosure are defined by the accompanying claims.

What is claimed is:

1. A display panel, comprising a plurality of sub-pixel units arranged in an array, wherein the array comprises N rows and 8M columns, sub-pixel units in each row are divided into a plurality of sub-pixel unit groups, and each sub-pixel unit group comprises a first sub-pixel unit, a second sub-pixel unit, a third sub-pixel unit, a fourth sub-pixel unit, a fifth sub-pixel unit, a sixth sub-pixel unit, a seventh sub-pixel unit and an eighth sub-pixel unit which are sequentially in eight adjacent columns along a first direction;

the display panel further comprises a plurality of power supply voltage lines, wherein in the each sub-pixel unit group, the first sub-pixel unit, the second sub-pixel unit, the third sub-pixel unit, the fourth sub-pixel unit, the fifth sub-pixel unit, the sixth sub-pixel unit, the seventh sub-pixel unit and the eighth sub-pixel unit are connected with a same power supply voltage line to receive a first power supply voltage; and M is an integer greater than or equal to 1, and N is an integer greater than or equal to 2, the eight adjacent columns comprise a column where the first sub-pixel unit is located, a column where the second sub-pixel unit is located, a column where the third sub-pixel unit is located, a column where the fourth sub-pixel unit is located, a column where the fifth sub-pixel unit is located, a column where the sixth sub-pixel unit is located, a column where the seventh sub-pixel unit is located, and a column where the eighth sub-pixel unit is located, no other column of sub-pixel units is between the column where the first sub-pixel unit is located and the column where the second sub-pixel unit is located, no other column of sub-pixel units is between the column where the second sub-pixel unit is located and the column where the third sub-pixel unit is located, no other column of sub-pixel units is between the column where the third sub-pixel unit is located and the column where the fourth sub-pixel unit is located, no other column of sub-pixel units is between the column where the fourth sub-pixel unit is located and the column where the fifth sub-pixel unit is located, no other column of sub-pixel units is between the column where the fifth sub-pixel unit is located and the column where the sixth sub-pixel unit is located, no other column of sub-pixel units is between the column where the sixth sub-pixel unit is located and the column where the seventh sub-pixel unit is located, and no other column of sub-pixel units is between the column where the seventh sub-pixel unit is located and the column where the eighth sub-pixel unit is located, each sub-pixel unit of the plurality of sub-pixel units comprises a light emitting circuit, a pixel driving circuit for driving the light emitting circuit to emit light, and a sensing circuit for sensing the pixel driving circuit to realize external compensation;

the display panel further comprises (2N+2) gate lines which are arranged along the first direction and configured to provide a gate scanning signal to the plurality of sub-pixel units;

all of the pixel driving circuits in the first sub-pixel unit, the fourth sub-pixel unit, the fifth sub-pixel unit and the eighth sub-pixel unit of each sub-pixel unit group of an (n)th row of sub-pixel unit groups are connected with a (2n−1)th gate line of the (2N+2) gate lines to receive the gate scanning signal and use the gate scanning signal as a first scanning driving signal;

all of the pixel driving circuits in the second sub-pixel unit, the third sub-pixel unit, the sixth sub-pixel unit and the seventh sub-pixel unit of the each sub-pixel unit group of the (n)th row of sub-pixel unit groups are connected with a (2n)th gate line of the (2N+2) gate lines to receive the gate scanning signal and use the gate scanning signal as a second scanning driving signal;

all of the sensing circuits in the first sub-pixel unit, the fourth sub-pixel unit, the fifth sub-pixel unit and the eighth sub-pixel unit of the each sub-pixel unit group of the (n)th row of sub-pixel unit groups are connected with a (2n+1)th gate line of the (2N+2) gate lines to receive the gate scanning signal and use the gate scanning signal as a first sensing driving signal;

all of the sensing circuits in the second sub-pixel unit, the third sub-pixel unit, the sixth sub-pixel unit and the seventh sub-pixel unit of the each sub-pixel unit group of the (n)th row of sub-pixel unit groups are connected with a (2n+2)th gate line of the (2N+2) gate lines to receive the gate scanning signal and use the gate scanning signal as a second sensing driving signal;

the (2n−1)th gate line and the (2n)th gate line are located on a same side of the (n)th row of sub-pixel unit groups, the (2n+1)th gate line and the (2n+2)th gate line are located on a same side of the (n)th row of sub-pixel unit groups, and the (2n−1)th gate line and the (2n+1)th gate line are located on two opposite sides of the (n)th row of sub-pixel unit groups, $1 \leq n \leq N$.

2. The display panel according to claim 1, wherein the plurality of power supply voltage lines are extending along a second direction, and in the each sub-pixel unit group, the same power supply voltage line is between the fourth sub-pixel unit and the fifth sub-pixel unit.

3. The display panel according to claim 2, wherein the first direction is a row direction of the array, and the second direction is a column direction of the array.

4. The display panel according to claim 2, wherein in the each sub-pixel unit group, the first sub-pixel unit, the second sub-pixel unit, the third sub-pixel unit, the fourth sub-pixel unit, the fifth sub-pixel unit, the sixth sub-pixel unit, the seventh sub-pixel unit and the eighth sub-pixel unit are axially symmetrically distributed with respect to the same power supply voltage line.

5. The display panel according to claim 1, wherein in the first direction, at least two adjacent sub-pixel unit groups are connected with different power supply voltage lines, and in the first direction, two adjacent sub-pixel unit groups are two sub-pixel unit groups, between which no other sub-pixel unit group is.

6. The display panel according to claim 5, further comprising a power supply voltage bus, wherein the plurality of power supply voltage lines are respectively connected with the power supply voltage bus.

7. The display panel according to claim 1, wherein the plurality of power supply voltage lines are further configured to be detected in a detection stage to determine whether each of the plurality of power supply voltage lines is defective.

8. The display panel according to claim 1, further comprising at least one auxiliary cathode line, wherein the auxiliary cathode line extends along a second direction, and in the second direction, the auxiliary cathode line is between two adjacent sub-pixel unit groups, and in the second direction, the two adjacent sub-pixel unit groups are two sub-pixel unit groups, between which no other sub-pixel unit group is.

9. The display panel according to claim 8, further comprising an array substrate and a metal line on the array substrate, wherein the auxiliary cathode line is electrically connected with the metal line.

10. The display panel according to claim 9, further comprising an insulation layer, a planarization layer, an auxiliary anode, and a pixel definition layer, which are on the metal line, wherein the auxiliary anode is in contact with the metal line through a first via-hole running through the insulation layer and the planarization layer, and the auxiliary cathode line is in contact with the auxiliary anode through a second via-hole running through the pixel definition layer.

11. The display panel according to claim 9, wherein the metal line comprises a source-drain electrode line and a gate line which are on the array substrate.

12. The display panel according to claim 1, wherein the display panel further comprises a plurality of first data lines, a plurality of second data lines, a plurality of third data lines and a plurality of fourth data lines, which are arranged along a second direction;

in the second direction, both of the first sub-pixel unit and the second sub-pixel unit in the each sub-pixel unit group are connected with a same first data line to receive a first data signal, both of the third sub-pixel unit and the fourth sub-pixel unit in the each sub-pixel unit group are connected with a same second data line to receive a second data signal, both of the fifth sub-pixel unit and the sixth sub-pixel unit in the each sub-pixel unit group are connected with a same third data line to receive a third data signal, and both of the seventh sub-pixel unit and the eighth sub-pixel unit in the each sub-pixel unit group are connected with a same fourth data line to receive a fourth data signal.

13. The display panel according to claim 12, wherein two gate lines are between every two adjacent rows of sub-pixel units, and two gate lines are respectively provided at two sides of the array along the second direction, and the two adjacent rows of sub-pixel units are two rows of sub-pixel units, between which no other row of sub-pixel units is.

14. The display panel according to claim 12, wherein in the each sub-pixel unit group, the same first data line is between the first sub-pixel unit and the second sub-pixel unit; the same second data line is between the third sub-pixel unit and the fourth sub-pixel unit; the same third data line is between the fifth sub-pixel unit and the sixth sub-pixel unit; and the same fourth data line is between the seventh sub-pixel unit and the eighth sub-pixel unit.

15. The display panel according to claim 12, further comprising a plurality of first sensing lines and a plurality of second sensing lines, which are arranged along the second direction, wherein in the second direction, all of the first sub-pixel unit, the second sub-pixel unit, the third sub-pixel unit and the fourth sub-pixel unit in the each sub-pixel unit group are connected with a same first sensing line to receive a first reference voltage signal or output a first sensing voltage signal; and in the second direction, all of the fifth sub-pixel unit, the sixth sub-pixel unit, the seventh sub-pixel unit and the eighth sub-pixel unit in the each sub-pixel unit group are connected with a same second sensing line to receive a second reference voltage signal or output a second sensing voltage signal.

16. The display panel according to claim 15, wherein in the each sub-pixel unit group,
the same first sensing line is between the second sub-pixel unit and the third sub-pixel unit; and the same second sensing line is between the sixth sub-pixel unit and the seventh sub-pixel unit.

17. The display panel according to claim 15, wherein in the each sub-pixel unit group,
the first sub-pixel unit, the second sub-pixel unit, the third sub-pixel unit and the fourth sub-pixel unit are axially symmetrically distributed with respect to the same first sensing line; and the fifth sub-pixel unit, the sixth sub-pixel unit, the seventh sub-pixel unit and the eighth sub-pixel unit are axially symmetrically distributed with respect to the same second sensing line.

18. The display panel according to claim 12, wherein the pixel driving circuit comprises a data writing circuit, a driving circuit and a charge storage circuit;
the driving circuit is connected with the data writing circuit, the charge storage circuit, the light emitting circuit and the sensing circuit, and is configured to control a driving current for driving the light emitting circuit to emit light;
the data writing circuit is further connected with the charge storage circuit, and is configured to receive the first scanning driving signal or the second scanning driving signal and write the first data signal or the second data signal or the third data signal or the fourth data signal into the driving circuit in response to the first scanning driving signal or the second scanning driving signal;
the sensing circuit is further connected with the charge storage circuit and the light emitting circuit, and is configured to receive the first sensing driving signal or the second sensing driving signal, and write a reference voltage signal into the driving circuit or read out a sensing voltage signal from the driving circuit in response to the first sensing driving signal or the sensing driving signal; and
the charge storage circuit is further connected with the light emitting circuit, and is configured to store the first data signal or the second data signal or the third data signal or the fourth data signal and the reference voltage signal that are written into the charge storage circuit.

19. The display panel according to claim 18, wherein
the data writing circuit comprises a first transistor, a gate electrode of the first transistor is configured to receive the gate scanning signal, a first electrode of the first transistor is configured to receive the first data signal or the second data signal or the third data signal or the fourth data signal, and a second electrode of the first transistor is connected with a first node;
the driving circuit comprises a second transistor, a gate electrode of the second transistor is connected with the first node, a first electrode of the second transistor is connected with a power supply voltage line to receive a first power supply voltage, and a second electrode of the second transistor is connected with a second node;
the charge storage circuit comprises a storage capacitor, a first electrode of the storage capacitor is connected with the first node, and a second electrode of the storage capacitor is connected with the second node;
the sensing circuit comprises a third transistor, a gate electrode of the third transistor is configured to receive the gate scanning signal and use the gate scanning signal as the first sensing driving signal or the second sensing driving signal, a first electrode of the third transistor is connected with a sensing line, and a second electrode of the third transistor is connected with the second node; and
the light emitting circuit comprises an organic light-emitting diode, a first electrode of the organic light-emitting diode is connected with the second node, and a second electrode of the organic light-emitting diode is configured to receive a second power supply voltage.

20. A display device, comprising the display panel according to claim 1.

* * * * *